United States Patent [19]
Hirose

[11] Patent Number: 5,835,398
[45] Date of Patent: Nov. 10, 1998

[54] FLAT NOR TYPE MASK ROM HAVING OFF-CELLS DISPOSED AT EVERY PREDETERMINED NUMBER OF MEMORY CELLS

[75] Inventor: Yukitoshi Hirose, Tokyo, Japan

[73] Assignee: NEC Corporation, Tokyo, Japan

[21] Appl. No.: 771,690

[22] Filed: Dec. 23, 1996

[30] Foreign Application Priority Data

Dec. 25, 1995 [JP] Japan ................................ 7-336276

[51] Int. Cl.$^6$ ................................................ G11C 17/12
[52] U.S. Cl. ........................... 365/104; 365/72; 257/391; 257/392
[58] Field of Search ................. 365/104, 72; 257/390, 257/391, 392

[56] References Cited

U.S. PATENT DOCUMENTS 5,585,297 12/1996 Sheng et al. .
5,665,621 9/1997 Hong ........................................ 438/278

Primary Examiner—David C. Nelms
Assistant Examiner—Andrew Q. Tran
Attorney, Agent, or Firm—Young & Thompson

[57] ABSTRACT

A flat NOR type mask ROM includes a plurality of bit-lines that are parallel to each other, a plurality of memory cells provided between adjacent bit-lines and a plurality of word-lines that are parallel to each other and orthogonal to the bit-lines, each word-line being connected to a plurality of the memory cells. The memory cells provided every predetermined number of bit-lines are OFF-cells which are always in an OFF state regardless of a potential level of the respective word-line.

4 Claims, 4 Drawing Sheets

FLAT NOR TYPE MASK ROM HAVING OFF-CELLS DISPOSED AT EVERY PREDETERMINED NUMBER OF MEMORY CELLS

BACKGROUND OF THE INVENTION

1. Field of the Invention

The present invention relates to a flat NOR type mask ROM and, particularly, to a flat NOR type mask ROM a read speed of which can be increased.

2. Description of the Prior Art

A NOR type mask ROM is one type of mask ROM. FIG. 1 shows a circuit construction of a memory cell array of a NOR type mask ROM. In FIG. 1, a plurality of bit-lines 2 each composed of a diffusion layer are provided in parallel to each other and a plurality of transistors each constituting a memory cell MC are provided between adjacent bit-lines 2. A plurality of parallel word-lines 4 are orthogonal to the bit-lines and are connected to respective pluralities of the memory cells.

In order to achieve a high integration of such NOR type mask ROM, it has been proposed to provide a contactless, flat NOR type memory cell structure by removing an element isolating region from the memory cell array. An example of such contact-less, flat NOR type memory cell is shown in FIGS. 2(a) and 2(b). In these figures, a plurality of bit-lines 2 each being composed of an N+ diffusion layer are formed in parallel on a P type semiconductor substrate 1 and a plurality of word-lines 4 of silicide which are orthogonally of the bit-lines 2 are formed on the bit-lines 2 through a gate oxide film 3. Each transistor which constitutes a memory cell MC has a source and a drain in a cross portion between the word-line 4 and the bit-line 2 and a channel is formed in a space portion. Thus, the element isolating region is eliminated to provide a contactless structure to thereby cause high integration of the memory cell array to be possible.

In this construction, however, when the memory cell transistors (ON transistors) which are turned ON when a word-line is selected are successive in the word-line direction as shown in FIG. 2(b) and the memory cells are selected, the channels of the respective ON transistors are connected in series, with respect to the bit-lines 2. Therefore, resistance and capacitance added to the bit-line increase, resulting in an increased charging time and decreased read speed.

BRIEF SUMMARY OF THE INVENTION

Objects of the Invention

Therefore, an object of the present invention is to provide a flat NOR type mask ROM capable of reducing resistance and capacitance added to a bit line to thereby increase the read speed.

Summary of the Invention

The flat NOR type mask ROM according to the present invention comprises a plurality of parallel bit-lines, a plurality of memory cells provided between adjacent bit-lines and a plurality of parallel word-lines that are orthogonal to the bit-lines and each connected to a plurality of the memory cells. A plurality of the memory cells provided between adjacent bit-lines are OFF cells which are always in an OFF state regardless of the level of the respective word-line.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
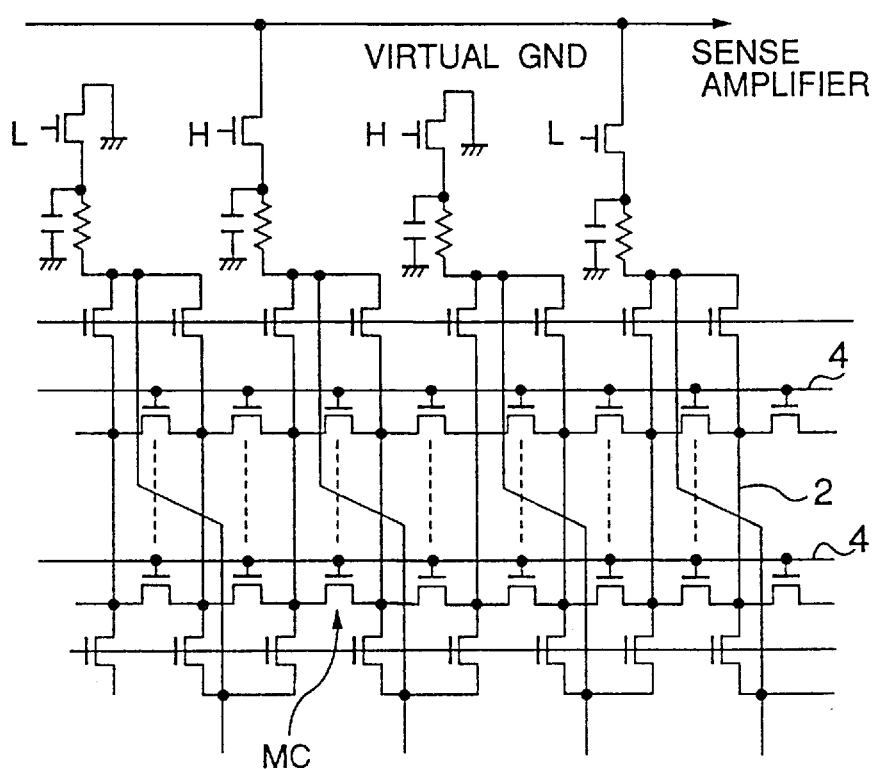
FIG. 1 is a circuit diagram showing a circuit construction of a memory cell array of a conventional flat NOR type mask ROM.
Figure 2A:
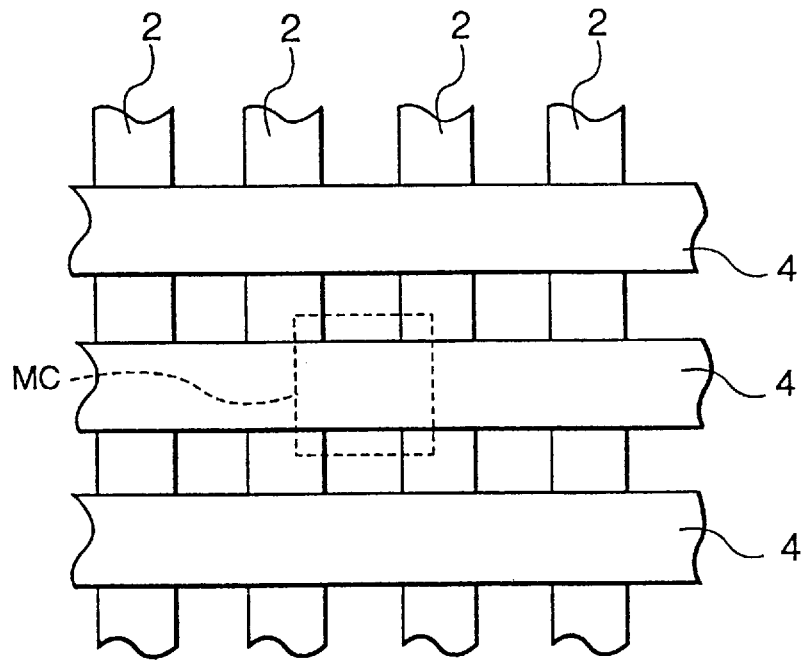
FIGS. 2(a) and 2(b) are a plan view and a cross sectional view of the memory cell portion shown in FIG. 1.
Figure 2B:
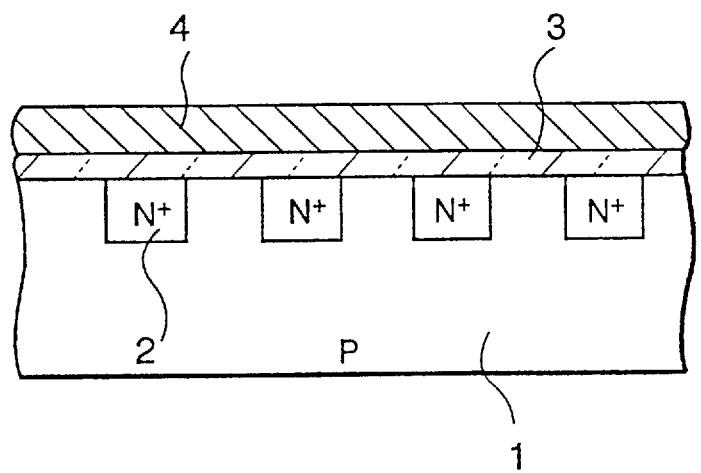
Figure 3:
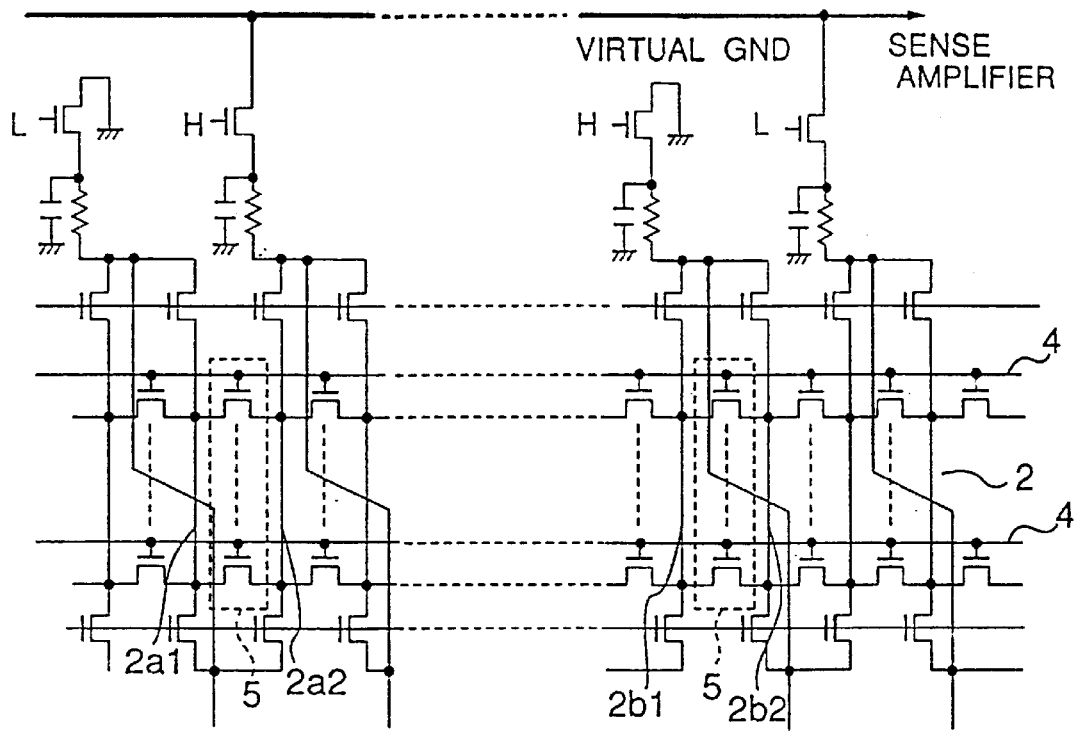
FIG. 3 is a circuit diagram showing an embodiment of the present invention.

The present invention will be described with reference to FIG. 3 in which the same portions as those shown in FIG. 1 are denoted by the same reference numerals. The present invention differs from the conventional flat NOR type mask ROM in that columns 5 of OFF-cells exist in a memory cell array. One column 5 of the OFF-cells includes all memory cells provided between adjacent bit-lines (e.g. bit-lines $2_{a1}$ and $2_{a2}$) and is provided every predetermined number of bit-lines, for example, every 16 bit-lines. In other words, there is one OFF-cell every 16 memory cells of the memory cells connected to one word-line. The OFF-cells constituting the OFF-cell column 5 are always in OFF state regardless of level of the word-line. The OFF-cells exist in the memory cell array and have no function of retaining data unlike other usual memory cells. Therefore, there is no address corresponding to the OFF-cells and a column decoder which is not shown does not select the OFF-cell columns 5. Alternatively, it may be possible to provide addresses corresponding to the OFF-cells, the use of which is inhibited.

Thus, since, even when all of the usual memory cells connected to one word-line are in ON state in selecting the word-line, there is an OFF-cell every predetermined number of the memory cell transistors, capacitance and resistance added to bit-lines are never increased.

Figure 4:
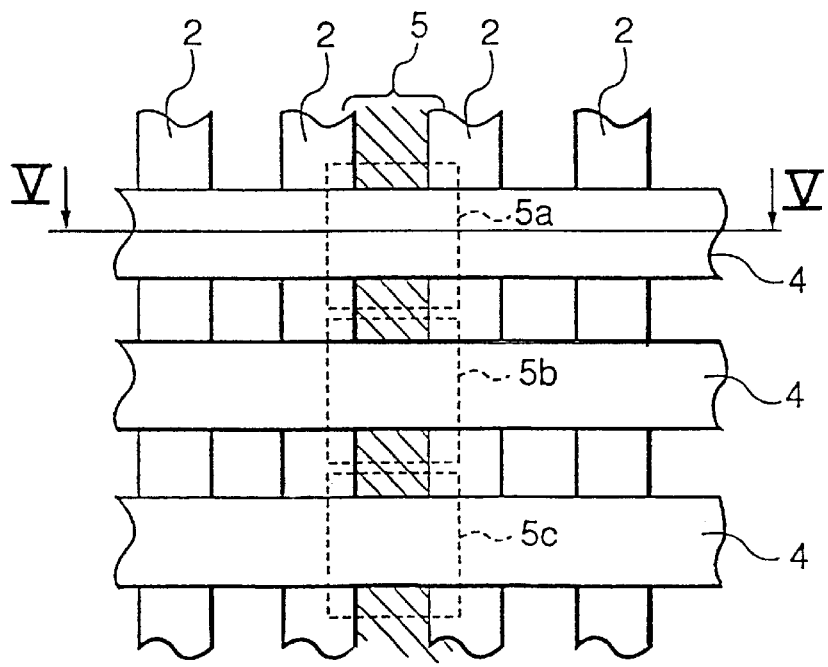
FIG. 4 is a plan view of the memory cell portion shown in FIG. 3.

FIG. 4 is a plan view of the memory cell array containing the OFF-cell columns 5. Each memory cell column 5 is constituted of a plurality of memory cell transistors ($5_a$, $5_b$, $5_c$,) each having a source and a drain connected between predetermined two adjacent bit-lines 2, a gate connected to the word-line 4 and a channel region composed of a hatched space portion between the two bit-lines 2.

A structure of the OFF-cell will be described with reference to FIG. 5 which shows a cross section taken along a line V—V in FIG. 4.

Figure 5:
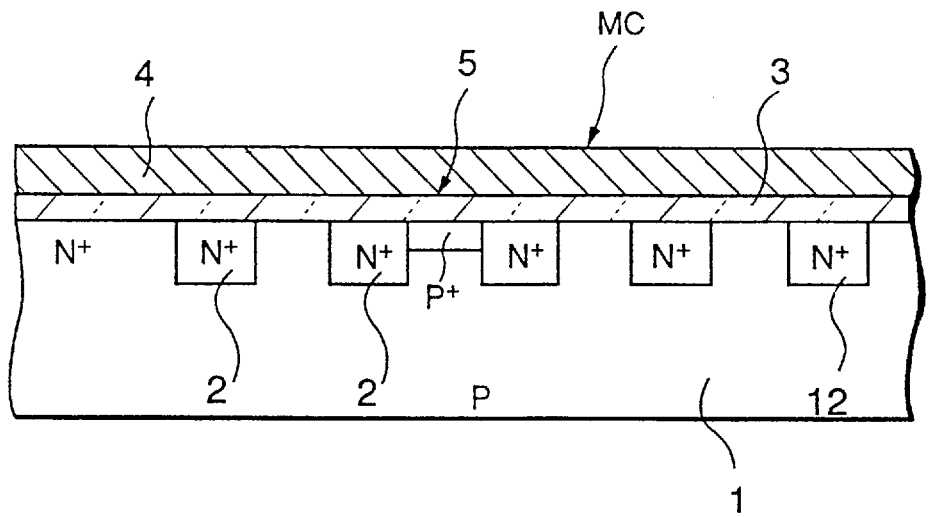
FIG. 5 is a cross sectional view of an embodiment of the memory cell portion shown in FIG. 3.

As shown in FIG. 5, on a major surface of a P type semiconductor substrate 1 (impurity density being $5\times10^{13}$ cm$^{-2}$), a plurality of parallel bit-lines 2 each composed of a diffusion layer (impurity density being $1\times10^{15}$ cm$^{-2}$) are formed with a predetermined pitch. A gate oxide film 3 is formed on the wafer and parallel word-lines 4 of silicide that are orthogonal to the bit-lines 2 are formed on the gate oxide film 3. The source and a drain of each memory cell transistor is connected between the word-line 4 and the bit-line 2 at a cross portion thereof and the channel is formed in the space portion between the adjacent bit-lines 2.

In this mask ROM, required data is written therein during a manufacturing step thereof. That is, data is written therein by ion-injecting P type impurity such as boron into channels of selected memory cell transistors by using a mask such as photo resist to change their threshold values. In this data write step, boron is also injected into channels of a plurality of transistors constituting the OFF-cell columns 5 at impurity density of $2\times10^{14}$ cm$^{-2}$ to control their threshold values. Thus, the memory cell transistors which are not turned ON by a gate voltage applied to the word-line 4 when the latter is selected, that is, the OFF-cell transistor columns 5 are provided.

In the mask ROM according to this embodiment, it is possible, in manufacturing the mask ROM, to form the OFF-cells simultaneously with the data write by providing windows for the OFF-cells in the mask for data write and ion-injecting boron through the windows. Therefore, the number of manufacturing steps of the conventional mask ROM is not increased and thus there is no increase of manufacturing cost.

Figure 6:
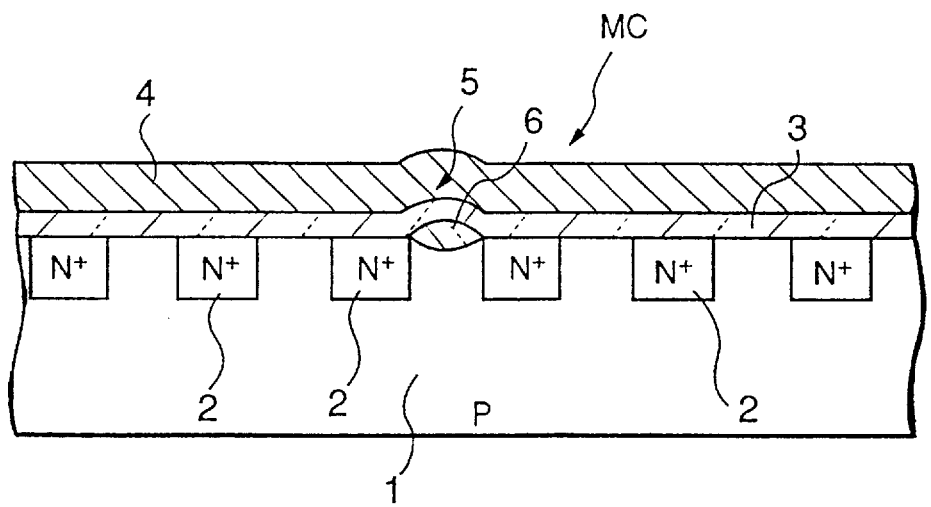
FIG. 6 is a cross sectional view of another embodiment of the memory cell portion shown in FIG. 3.

Further, in the present invention, instead of the ion-injection of impurity for regulating the threshold values as shown in FIG. 5, it may be possible to provide the OFF-cells by thickening the gate oxide film in the channel region. FIG. 6 is a cross sectional view showing an example of the latter case. In FIG. 6, the thickness of a gate oxide film 3 on channel every a predetermined number of the memory cells in the word direction is increased to 1 ~3 μm by forming a gate oxide film 6 on a surface of a semiconductor substrate 1 in a channel region, forming the gate oxide film 3 thereon and then forming a gate oxide film 13 on the gate oxide film 3. Thus, the thicker gate oxide film is formed, so that the memory cells can be made an OFF-cell column 5.

By forming such thick oxide film, it is possible to constitute a corresponding memory cell as an OFF-cell by which ON cells connected to one word-line can be isolated.

In this embodiment, manufacturing steps after the formation of the thick oxide film 6 are the same as those in the conventional manufacturing method without necessity of changing the manufacturing steps thereof, when the thick oxide film 6 is formed by selectively oxidizing a surface of a P type semiconductor substrate 1 before or after an N+ diffusion layer 2 is formed on the substrate 1. Further, the thick oxide film 6 itself can be realized by modifying only a portion of the mask which is usually used to manufacture the element isolating region for insulating and separating a cell region from a peripheral circuit region, without changing the manufacturing steps of the flat NOR type mask ROM. Therefore, the manufacturing method thereof is prevented from becoming complicated, resulting in that the flat NOR type mask ROM can be manufactured economically.

Although the present invention has been described with reference to specific embodiments, this description is not meant to be construed in a limiting sense. Various modifications of the disclosed embodiments will become apparent to persons skilled in the art upon reference to the description of the present invention. It is, therefore, contemplated that the appended claims will cover any modification or embodiments as fall within the true scope of the present invention.

What is claimed is:

1. A mask ROM comprising:
    a plurality of bit-lines extending in parallel to each other;
    a plurality of memory cells, each between respective adjacent pairs of said bit-lines; and
    a plurality of word-lines that are parallel to each other and orthogonal to said bit-lines, each of said word-lines being connected to plural ones of said memory cells, said memory cells provided between at least two of said bit-lines being OFF-cells which are always in an OFF state regardless of a potential level of a respective one of said word-lines,
    wherein said OFF-cells are provided every predetermined number of said bit-lines.

2. The mask ROM as claimed in claim 1, wherein threshold voltages of said OFF-cells are higher than a voltage applied to said word-lines.

3. The mask ROM as claimed in claim 1, wherein said OFF-cells comprise MOS transistors having channel regions of a first conductivity type doped with an impurity of the first conductivity type.

4. A mask ROM comprising:
    a plurality of bit-lines extending in parallel to each other;
    a plurality of memory cells, each between respective adjacent pairs of said bit-lines; and
    a plurality of word-lines that are parallel to each other and orthogonal to said bit-lines, each of said word-lines being connected to plural ones of said memory cells, said memory cells provided between at least two of said bit-lines being OFF-cells which are always in an OFF state regardless of a potential level of a respective one of said word-lines,
    wherein said OFF-cells and others of said memory cells comprise MOS transistors, and wherein insulating films on channel regions of said MOS transistors of said OFF-cells are thicker than insulating films on channel regions of said MOS transistors of said other memory cells.

* * * * *